US011119148B2

(12) United States Patent
Nieves et al.

(10) Patent No.: US 11,119,148 B2
(45) Date of Patent: Sep. 14, 2021

(54) TEST PROBE ASSEMBLY WITH FIBER OPTIC LEADS AND PHOTODETECTORS FOR TESTING SEMICONDUCTOR WAFERS

(71) Applicant: International Business Machines Corporation, Armonk, NY (US)

(72) Inventors: Pablo Nieves, Schenectady, NY (US); Kushagra Sinha, Wappingers Falls, NY (US); Reinaldo Vega, Mahopac, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/164,130

(22) Filed: Oct. 18, 2018

(65) Prior Publication Data

US 2020/0124663 A1    Apr. 23, 2020

(51) Int. Cl.
*G01R 31/28*      (2006.01)
*G01R 31/311*     (2006.01)
(Continued)

(52) U.S. Cl.
CPC ....... *G01R 31/2887* (2013.01); *G01R 1/0408* (2013.01); *G01R 1/06794* (2013.01);
(Continued)

(58) Field of Classification Search
CPC .............. G01R 31/2887; G01R 1/0408; G01R 1/06794; G01R 31/2831; G01R 31/311;
(Continued)

(56) References Cited

U.S. PATENT DOCUMENTS 5,091,692 A * 2/1992 Ohno ................. G01R 1/07314
                                        324/750.23
5,321,351 A    6/1994 Swart et al.
(Continued)

FOREIGN PATENT DOCUMENTS

JP        850007 A    2/1996
JP        949867 A    2/1997

OTHER PUBLICATIONS

IBM et al., "Alignment of Wafers in Test Apparatus," ip.com, IP.com No. IPCOM000068403D, Sep. 1, 1979, 3 pages.
(Continued)

*Primary Examiner* — Jay Patidar
(74) *Attorney, Agent, or Firm* — Randall Bluestone; Ryan, Mason & Lewis, LLP

(57) ABSTRACT

A test probe assembly includes a probe card, a plurality of test probes mounted to the probe card with each of the test probes having a probe tip segment and a probe end for positioning adjacent respective individual test pads of a semiconductor wafer, and a fiber optic lead mounted to each test probe. The fiber optic leads are arranged to direct incident light toward respective individual test pads of the semiconductor wafer. A plurality of photodetectors may be arranged about the probe card with individual photodetectors configured for reception of light reflected off the respective individual test pads to emit output signals used to generate image data representative of the individual test pads on the semiconductor wafer. The image data may be utilized to align the test pads with the test probes for subsequent testing.

29 Claims, 11 Drawing Sheets

(51) Int. Cl.
*G01R 1/04* (2006.01)
*G01R 1/067* (2006.01)
*H01L 21/68* (2006.01)

(52) U.S. Cl.
CPC ........ *G01R 31/2831* (2013.01); *G01R 31/311* (2013.01); *H01L 21/68* (2013.01); *H05K 2203/166* (2013.01)

(58) Field of Classification Search
CPC ............... G01R 1/071; G01R 31/2884; G01R 1/07314; G01R 31/2808; H01L 21/68; H05K 2203/166
See application file for complete search history.

(56) References Cited

U.S. PATENT DOCUMENTS

| | | | |
|---|---|---|---|
| 5,381,103 | A | 1/1995 | Edmond et al. |
| 5,442,299 | A | 8/1995 | Caggiano |
| 5,585,923 | A | 12/1996 | Nose et al. |
| 5,631,571 | A | 5/1997 | Spaziani et al. |
| 5,877,858 | A * | 3/1999 | Kerstens ............ G01B 11/2441 356/496 |
| 6,059,982 | A | 5/2000 | Palagonia et al. |
| 6,118,894 | A | 9/2000 | Schwartz et al. |
| 6,795,185 | B2 | 9/2004 | Yoshizawa et al. |
| 6,859,031 | B2 | 2/2005 | Pakdaman et al. |
| 6,943,353 | B2 | 9/2005 | Elmore et al. |
| 7,208,724 | B2 | 4/2007 | Moore et al. |
| 7,378,861 | B1 * | 5/2008 | Malendevich ......... G02B 6/124 324/750.23 |
| 7,582,183 | B2 | 9/2009 | Tang |
| 7,688,097 | B2 | 3/2010 | Hayden et al. |
| 7,759,953 | B2 * | 7/2010 | Strid .................. G01R 1/06711 324/762.05 |
| 7,761,983 | B2 | 7/2010 | Hayden et al. |
| 9,255,945 | B2 | 2/2016 | Detofsky et al. |
| 2002/0008528 | A1 | 1/2002 | Sato et al. |
| 2005/0083038 | A1 * | 4/2005 | Rothaug ............ G01R 1/06794 324/750.02 |
| 2007/0096763 | A1 * | 5/2007 | Ehrmann ............. B23K 26/042 324/750.23 |
| 2007/0220958 | A1 * | 9/2007 | Gotthard ................ G01Q 70/04 73/105 |

OTHER PUBLICATIONS

IBM et al., "Optical Alignment System for Probe, Pad Registration," ip.com, IP.com No. IPCOM000121714D, Sep. 1, 1991, 3 pages.

M.D. Feuer et al., "Broadband Optoelectronic Wafer Probing," Proceedings of IEEE/Cornell Conference on Advanced Concepts in High Speed Semiconductor Devices and Circuits, Aug. 2-4, 1993, pp. 485-493.

W.-S. Hua et al., "Fiberoptic Metal Detector Capable of Profile Detection," Proceedings of SPIE—the International Society for Optical Engineering, Mar. 31, 2011, 15 pages.

Electronics-Tutorials.WS, "Light Sensors," https://www.electronics-tutorials.ws/io/io_4.html, Aug. 15, 2013, 11 pages.

List of IBM Patents or Patent Applications Treated as Related.

P.Mell et al., "The NIST Definition of Cloud Computing: Recommendations of the National Institute of Standards and Technology," National Institute of Standards and Technology, U.S. Department of Commerce Special Publication 800-145, Sep. 2011,7 pages.

* cited by examiner

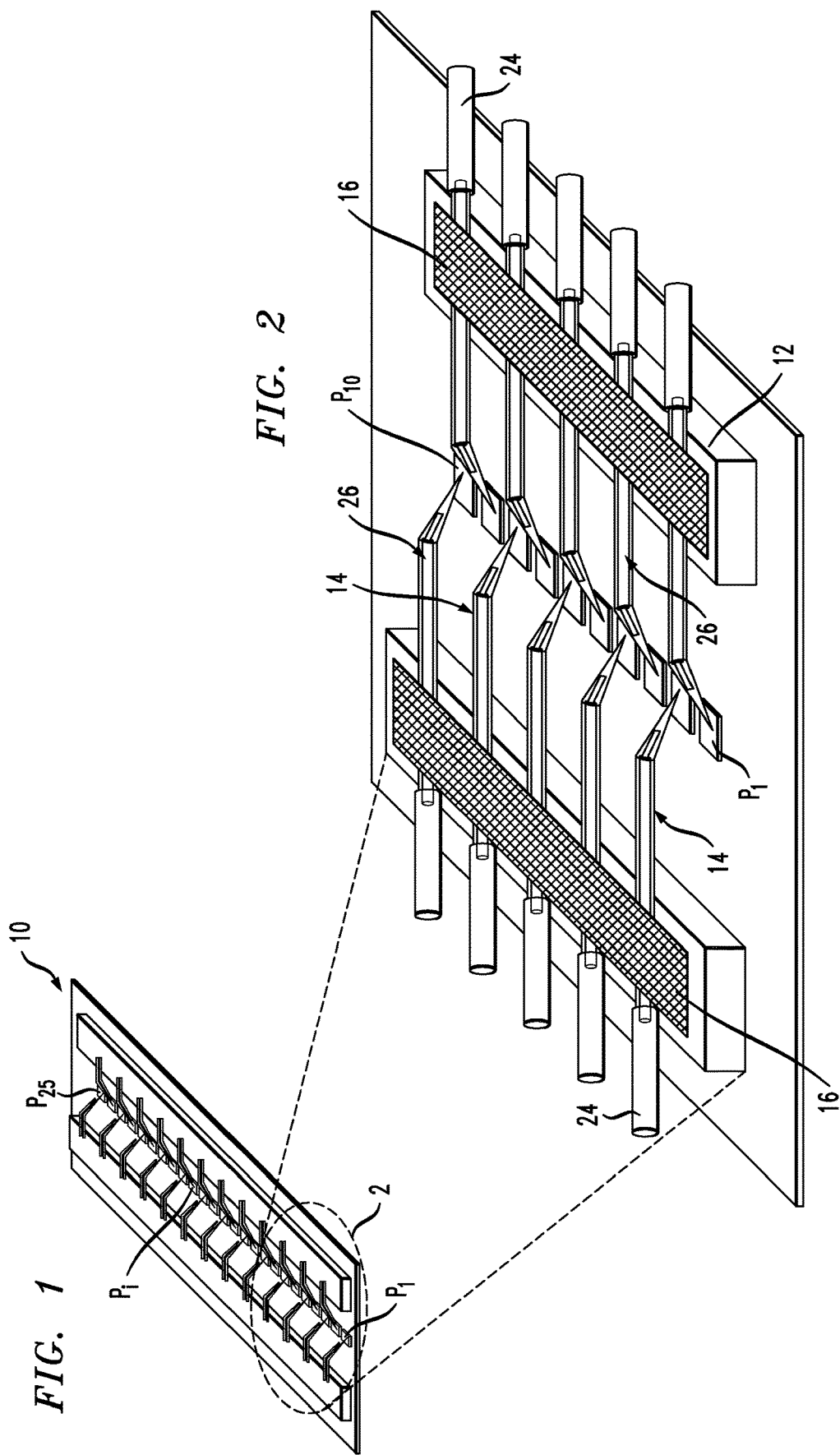

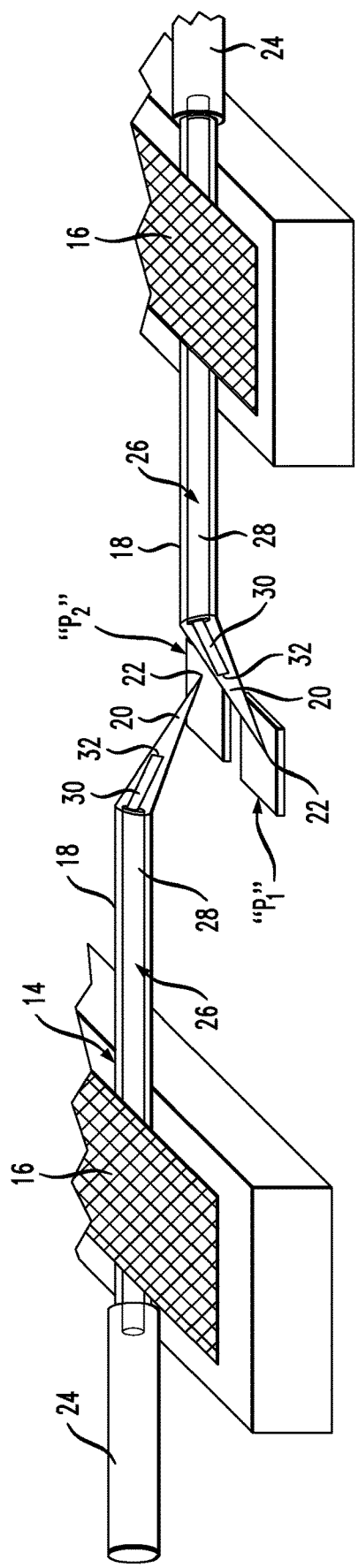

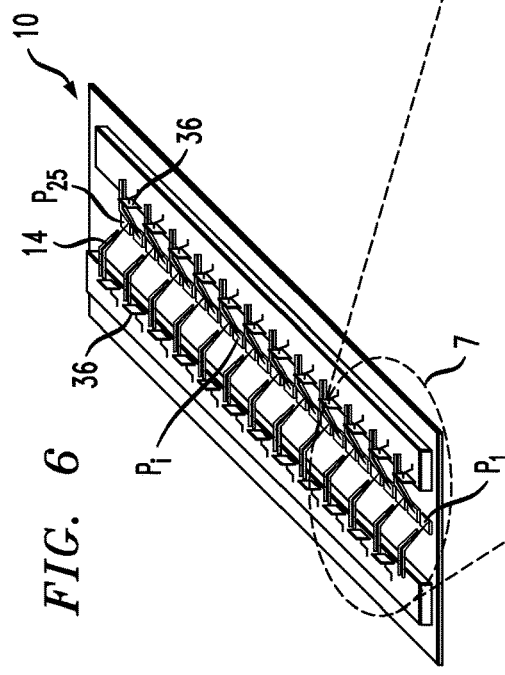
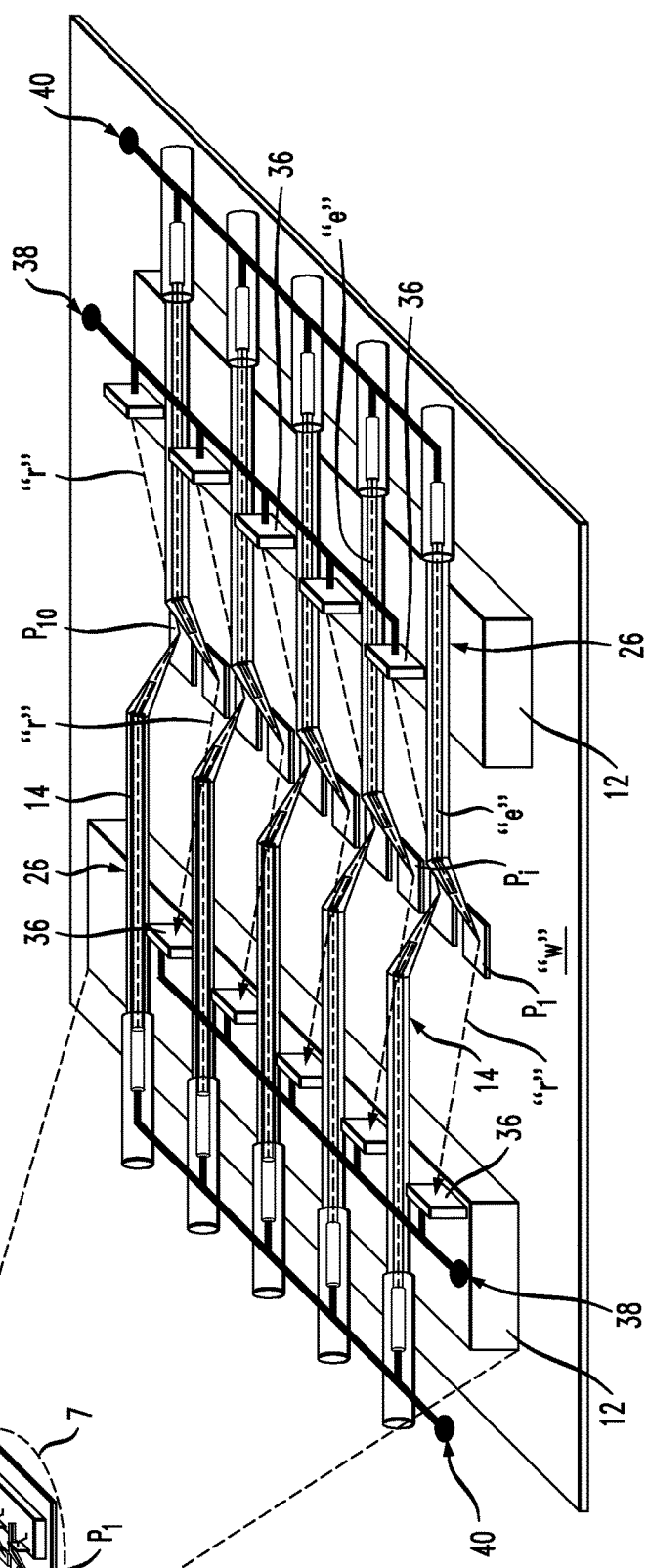

WHERE;
Iv = LUMINOUS INTENSITY (CANDELA)
Lv = LUMINANCE (CANDELA PER SQ METER)
$V_{1 \text{ TO } 25}$ = VOLTAGE GENERATED FROM EACH PHOTODETECTOR

TEST PROBE ASSEMBLY WITH FIBER OPTIC LEADS AND PHOTODETECTORS FOR TESTING SEMICONDUCTOR WAFERS

BACKGROUND

The present application generally relates to the testing of semiconductor wafers, and more particularly, relates to a test probe assembly, a system and associated methodology capable of generating image data of test pads of a semiconductor wafer prior to the performance of a testing procedure with the test probes of the assembly. The image data may be used to facilitate alignment of the test pads of the semiconductor wafer with the test probes, and also assist in identifying displaced test pads and/or misoriented or bent test probes.

SUMMARY

Embodiments of the present application provide techniques for confirming test pad location on a semiconductor wafer and test probe integrity.

In one embodiment, a test probe assembly includes a probe card, a plurality of test probes mounted to the probe card with each of the test probes having a probe end for positioning adjacent respective individual test pads of a semiconductor wafer, and a fiber optic lead mounted to each test probe. The fiber optic leads are arranged to direct incident light toward respective individual test pads of the semiconductor wafer.

In another embodiment, a method includes the steps of providing a probe card, coupling a plurality of test probes to the probe card and mounting a fiber optic lead to at least one test probe. The fiber optic lead is configured to transmit light.

In another embodiment, a method includes the steps of positioning a test probe assembly including a probe card and a plurality of test probes extending from the probe card relative to a semiconductor wafer, transmitting light from a fiber optic lead mounted to each test probe toward an individual test pad of the semiconductor wafer, collecting light reflected off each individual test pad with a photodetector associated with each test probe and generating image data representative of each test pad in response to electrical output signals emitted by the photodetectors.

In another embodiment, a system includes a test probe assembly having a probe card, a plurality of test probes mounted to the probe card with each of the test probes defining a probe end for positioning adjacent respective individual test pads of a semiconductor wafer, a fiber optic lead mounted to each test probe and arranged to direct incident light toward respective individual test pads of the semiconductor wafer, and a plurality of photodetectors arranged about the probe card. Individual photodetectors are configured for reception of light reflected off the respective individual test pads to generate output signals representative of a characteristic of either the individual test pads or the test probes. The system further includes a light source coupled to the fiber optic leads, a stage for holding the semiconductor wafer and a processor for moving the stage relative to the test probes and the fiber optic leads such that the fiber optic leads scan the test probes in at least and an x-direction and a y-direction. The processor is configured for receiving the output signals from the photodetectors to provide image data based on the output signals. The system further includes a visual display for displaying at least one image associated with the image data.

In yet another embodiment, a combination includes a test probe for testing the integrity of a test pad of a semiconductor wafer and a fiber optic lead mounted to the test probe.

BRIEF DESCRIPTION OF THE DRAWINGS

FIG. 1 is a schematic view of a section of the test probe assembly for facilitating alignment with test pads of a semiconductor wafer according to one or more embodiments of the invention.

FIG. 2 is an enlarged view of the area of isolation depicted in FIG. 1 illustrating the test probes and the individual fiber optic leads coupled to each test probe positioned with respect to a semiconductor wafer according to one or more embodiments of the invention.

FIG. 3 is an enlarged perspective view illustrating the test probes and the individual fiber optic leads according to one or more embodiments of the invention.

FIG. 4 is an axial view in cross-section illustrating one methodology for coupling the fiber optic leads to the test probes according to one or more embodiments of the invention.

FIG. 5 is an axial view in cross-section illustrating another methodology for coupling the fiber optic leads to the test probes according to one or more embodiments of the invention.

FIG. 6 is a perspective view similar to the view of FIG. 1 illustrating the photodetectors of the test probe assembly according to one or more embodiments of the invention.

FIG. 7 is an enlarged view of the area of isolation depicted in FIG. 6 illustrating the incident light rays emitted from each fiber optic of a respective test probe directed onto the test pads of the semiconductor wafer and the reflected light rays captured by the individual photodetectors according to one or more embodiments of the invention.

DETAILED DESCRIPTION

Figure 8:
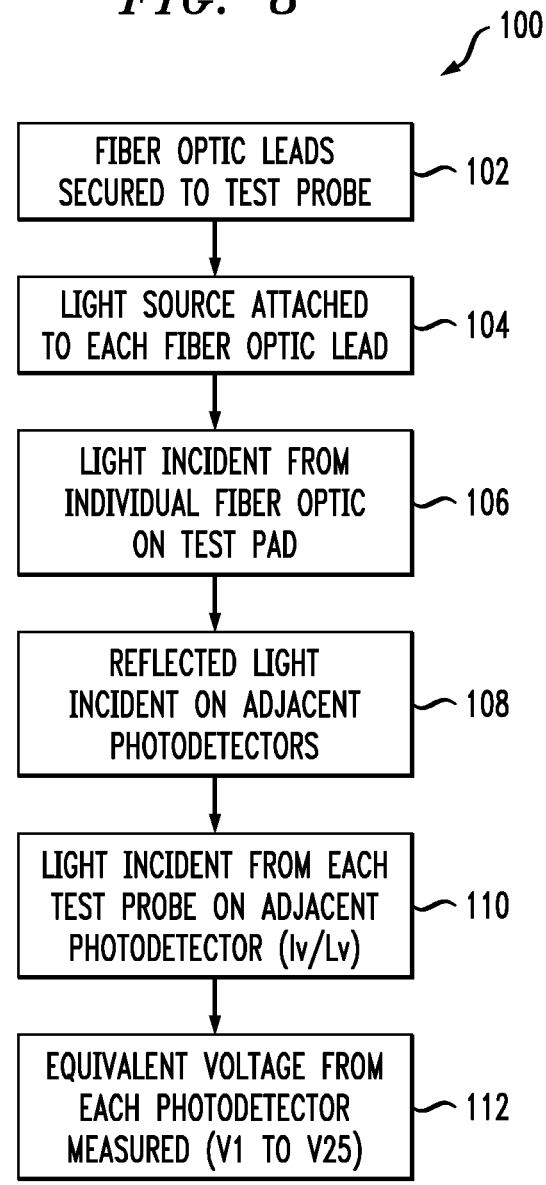
FIG. 8 is a flow chart illustrating one methodology of use of the test probe assembly for forming images of the test pads according to one or more embodiments of the present application.

Illustrative embodiments will be described hereinbelow of a test probe assembly, system and methodology capable of creating image data of individual test pads of semiconductor wafers to determine the centers of each test pad to facilitate alignment of the individual test probes with the centers of the test pads for testing of the electronic components of the semiconductor wafer. These processes or steps are performed prior to contact of the test pads with the test probes. Further illustrative embodiments include utilizing the image data to identify displaced test pads and/or to ascertain the integrity of the individual test probes, e.g., whether the test probe is misaligned, bent or otherwise subject to malfunctioning.

Prior to explaining details of the illustrative embodiments of the test probe alignment and integrity system of the present application, a brief explanation of conventional test probe assemblies and their deficiencies serving as motivation for the illustrative embodiments will now be provided. A conventional test probe assembly is mountable to an electrical testing system which is used in conducting functional, electrical and/or parametric testing of semiconductor wafers. Testing systems with various testing capabilities are commercially available from multiple manufacturers. One conventional test system is the Tokyo Electron, Ltd. (TEL) prober. This prober generally includes a frame, a movable stage and a wafer chuck which holds the semiconductor wafer to be tested. A drive mechanism drives the stage and the wafer chuck in at least the x-direction and the y-direction. The frame includes a circular opening and having a probe card or ring mounted about the circular opening. The probe card includes a series of individual needle probes arranged to contact the test pads of the semiconductor wafer during a testing procedure. The prober further includes a camera to image the probes of the probe card and the test pads of the semiconductor wafer to assist in the aligning process. The testing procedure generally includes aligning the test probes with the test pads of the semiconductor wafer and moving the probe card or stage to cause electrical contact of the test pads with respective individual test probes. Testing and validation of the circuitry on the wafer are performed through the test probes. A Central Processing Unit (CPU) controls the entire operation of the probe system.

In many instances in using a testing system such as the TEL prober, the camera can focus on only a certain number of the test probes of the probe card or on a certain number of the test pads of the semiconductor wafer at one time. Thus, alignment of the remaining test probes and test pads is assumed, i.e., alignment is not confirmed. Proper alignment of the test probes with the center of each of the test pads is critical to obtain accurate test results of the functioning of the circuitry on the semiconductor wafer. Other difficulties associated with testing of semiconductor wafers include displacement of one or more test pads on the substrate or the presence of a misoriented or bent test probe.

Testing of the semiconductor wafers is performed at many stages of the semiconductor manufacturing process to enable detection, diagnosis, and correction of defective processes. Preferably, the determination of any issue with the wafer occurs at an early stage to offset wafer failure and associated cost, as well as to take corrective measures on any defective test probes of the probe card. Thus, illustrative embodiments of the present application provide an apparatus, a system and a methodology to confirm test pad alignment, to determine test pad displacement and/or to identify defective test probes at early stages in the manufacturing processes and prior to initiating a subsequent testing procedure. The apparatus, system and methodology can achieve these objectives without contact of the test probes with the test pads.

FIGS. 1-2 illustrate an exemplary embodiment of the test probe assembly of the present disclosure. The test probe assembly may be incorporated within any conventional wafer testing system including the TEL prober discussed hereinabove. In FIGS. 1-2, the test probe assembly 10 is shown positioned with respect to a semiconductor wafer "W" coupled to a wafer chuck (not shown) and having test pads $P_1$ to $P_{25}$ disposed along its surface. The wafer chuck is mounted on a stage (not shown) of the testing system. The test assembly 10 includes a probe card 12 and a plurality of test probes 14 mounted to, or coupled with, the probe card 12. Although depicted in FIGS. 1-2 as two separate rectangular substrates, the probe card 12 is typically in the shape of a continuous ring. The probe card 12 is held within the testing system by the card holding mechanism (not shown). The test probes 14 are distributed about the probe card 12, e.g. preferably, to be in alignment with respective test pads $P_1$ to $P_{25}$ of the semiconductor wafer "W", i.e., each test probe 14 has a dedicated test pad $P_i$. The test probes 14 are secured relative to the probe card 12 via conventional means including an epoxy layer 16 or any other suitable cement or adhesive.

The probe card 12 and the test probes 14 are customized to the semiconductor wafer "W" undergoing testing. In one exemplary embodiment depicted in the FIGS. 1-2, the probe card 12 has twenty-five (25) test probes 14 spaced about the probe card 12. Other arrangements are also envisioned including, but not limited to, two rows of fifty (50) test probes 14.

Referring now to FIG. 3, in conjunction with FIG. 2, each test probe 14 includes a linear segment 18, a probe tip segment 20 obliquely arranged relative to the linear segment 18 and a contact probe end 22 which contacts the test pad $P_1$ to $P_{25}$. A sheathing 24 is positioned over an end of the linear segment 18 of the test probe 14 remote from the probe tip segment 20. The sheathing 24 is made of a non-magnetic material.

Each test probe 14 includes a fiber optic lead 26, e.g., a fiber optic cable, secured to the test probe 14 and extending along a major portion of its length. Each fiber optic lead 26 may be a single optical fiber or contain a plurality of optical fibers grouped together to form a cable. The optical fiber(s) of the fiber optic lead 26 may be fabricated from glass or any suitable polymeric material, and may be rigid or flexible. The fiber optic lead 26 includes a linear segment 28, a fiber tip segment 30 obliquely arranged relative to the linear segment 28 to follow the path of the probe tip segment 20, and a light emitting end 32. In one exemplary embodiment, the probe tip segment 20 and the fiber tip segment 30 are arranged at the same oblique angle, e.g., are in parallel relation, such that light emitted by the light emitting end 32 is generally aligned with the probe end 22. The light emitting end 32 segment of the fiber optic lead 26 terminates proximal or spaced from the probe end 22 of the test probe 14. This arrangement ensures that the fiber optic lead 26 does not interfere with the testing procedure to be subsequently performed by the test probes 14 on the test pads $P_1$ to $P_{25}$ of the semiconductor wafer "W".

FIGS. 4-5 illustrate alternate methodologies for securing the fiber optic lead 26 to each test probe 14. In FIG. 4, the fiber optic lead 26 is directly secured to the outer surface of the test probe 14 in side-by-side relation with a cement or adhesive. In exemplary embodiments, the fiber optic lead 26 may be secured along a majority of its length to the test probe 14 or secured at spaced locations to the test probe 14. In FIG. 5, the fiber optic lead 26 has a coaxially mounted outer sheath or wrapper 34 extending along at least a portion of its length. The fiber optic lead 26 may be directly secured to the outer sheath 34 with the use of the adhesives and cements in either of the afore-described manners. Other methodologies for coupling the fiber optic lead 26 and the test probes 14 are also envisioned.

Referring now to FIGS. 6-7, the test probe assembly 10 further includes a plurality of photodetectors 36 or photosensors mounted about the probe card 12. Each photodetector 36 is associated with a respective test probe 14 and fiber optic lead 26 combination and, thus, also with a corresponding test pad $P_i$. In particular, each photodetector 36 is aligned with a respective test probe 14 and mounted fiber optic lead 26, and with a test pad $P_i$, such that light rays emitted "e" (shown in dashed lines) by the fiber optic lead 26 and incident on the test pad $P_i$ are reflected off the test pad $P_i$ as reflected light rays "r" (shown in dashed lines) and captured by the photodetector 36. The photodetectors 36 may be secured to the probe card 12 by conventional methodologies and may be orthogonal to the probe card 12 such that the sensors of the photodetectors 36 are positioned to directly face and receive the incoming reflected light "r" incident on the photodetectors 36. FIG. 7 also schematically depicts the photodetector connection(s) 38 extending from the individual photodetectors 36 to be coupled with a control unit or processor (not shown) for processing, and the light source connection(s) 40 coupled to the fiber optic leads 26 for delivering light to the fiber optic leads 26.

Referring now to FIG. 8, a flow chart 100 illustrating an exemplary methodology of use of the present disclosure is depicted. The methodology includes securing a fiber optic lead 26 to each test probe 14 (STEP 102), attaching a light source to each of the fiber optic leads 26 (STEP 104), directing incident light from the fiber optic leads 26 on respective test pads $P_1$ to $P_{25}$ associated with the fiber optic lead 26 and the test probes 14 (STEP 106), capturing the reflected light with a corresponding photodetector 36 (STEP 108), detecting the light intensity (STEP 110), and measuring the electrical response in the form of output voltage V1 to V25 generated by each photodetector 36 (STEP 112). The electrical response in the form of output voltage V1 to V25 is used to generate image data of each of the test pads $P_1$ to $P_{25}$. In an alternate embodiment, the measured electrical response could be an output current I of the photodetectors 26.

Figure 9:
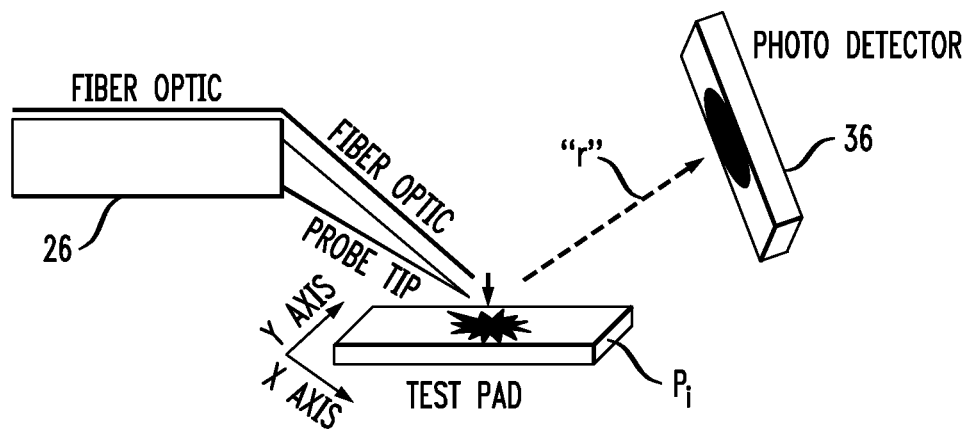
FIG. 9 is a schematic view illustrating mapping of an image of an individual test pad with the test probe assembly according to one or more embodiments of the invention.
Figure 10:
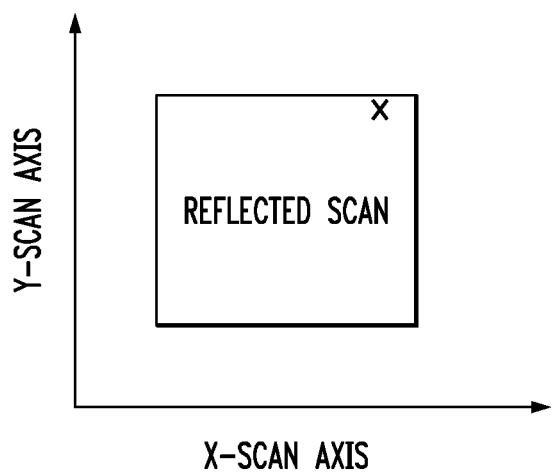
FIG. 10 is a graph illustrating an exemplative image of the individual test pad according to one or more embodiments of the invention.

The methodology depicted in the flow chart of FIG. 8 is inclusive of at least some of the fundamental steps required for voltage or current mapping of the test pads $P_1$ to $P_{25}$ to determine the physical parameters of the test pads $P_1$ to $P_{25}$ and, eventually, in determining the absolute center of each test pad $P_1$ to $P_{25}$. In accordance with an exemplary embodiment of the present application depicted schematically in FIGS. 9-10, each of the test pads $P_1$ to $P_{25}$ are scanned in the x-direction and the y-direction, i.e., by directing light emitted by the fiber optic lead 26 on each test probe 14 onto the test pad $P_i$ in both x and y-directions to encompass the entire test pad $P_i$. This is achieved by moving the stage of the testing system, and thus, the chuck holding the semiconductor wafer "W," relative to the probe card 12 and the test probes 14. This movement, of course, is automated, controlled via the processor of the test system. Alternatively, the probe card 12 and the test probes 14 may be moved relative to the semiconductor wafer "W." The reflected light "r" is captured by each photodetector 36 which generates an electrical signal in the form of a voltage or a current output which is processed via known voltage or current mapping techniques to create the image or graph depicted in FIG. 10. In general, if the test pad $P_i$ is free from contamination, e.g., oxide layers, and/or other distortions, the generated image will generally correlate to the size of the test pad $P_i$.

Figure 11:
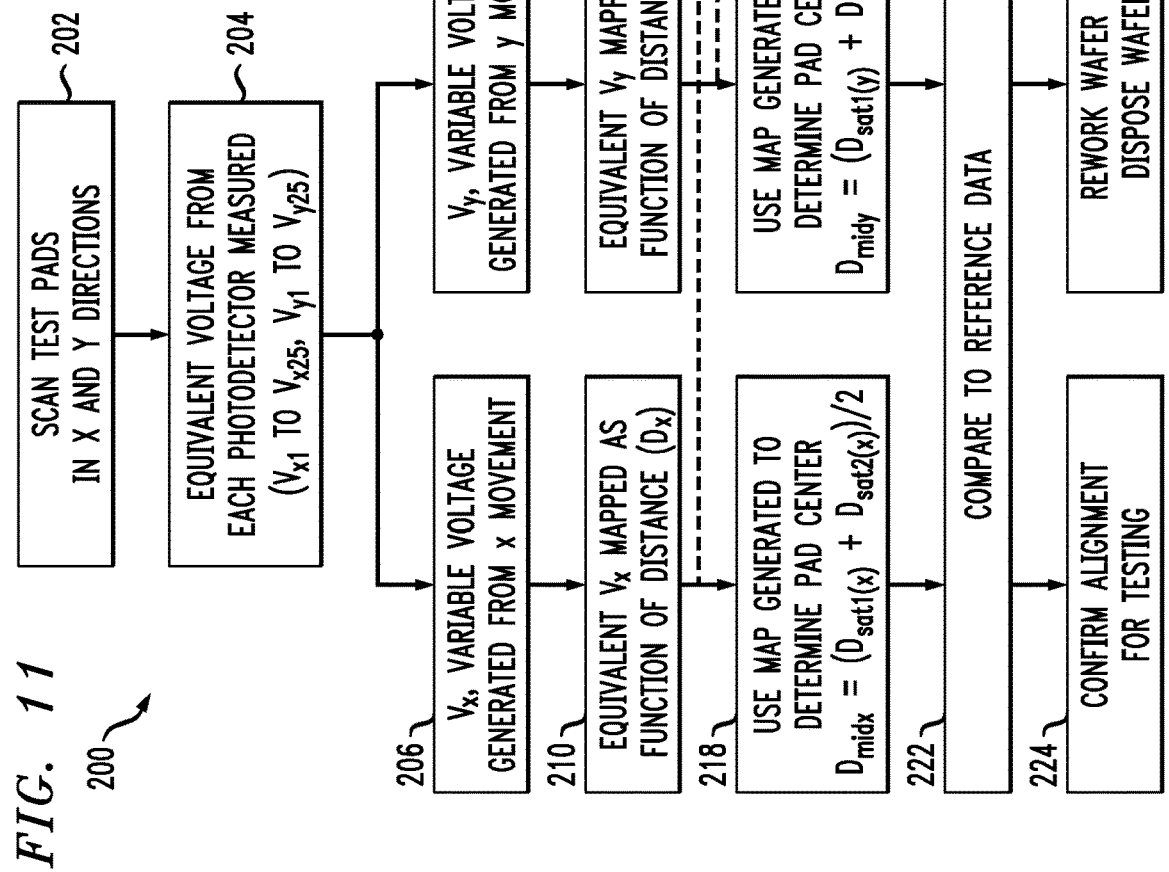
FIG. 11 is a flow chart illustrating an exemplary methodology for determining the center of each test pad to facilitate alignment of the test probes with their respective test pads of the semiconductor wafer according to one or more embodiments of the invention.

FIG. 11 is a flow chart 200 depicting one exemplary methodology for determining the absolute center of each test pad $P_1$ to $P_{25}$ utilizing the previously described scanning and imaging processes. In STEP 202, light is emitted by each fiber optic lead 26 associated with a test probe 14 on the respective test pads $P_1$ to $P_{25}$ to scan the test pads $P_1$ to $P_{25}$ in both the x and y-directions. The photodetectors 36 capture the incident light off each of the test pads $P_1$ to $P_{25}$, detects the light intensity and generates one or more electric signals, e.g., a voltage output, represented as $V_{X1}$ to $V_{X25}$ and $V_{Y1}$ to $V_{Y25}$ where $V_{X1}$ to $V_{X25}$ is the voltage generated during the X scan for the respective test pads $P_1$ to $P_{25}$ and $V_{Y1}$ to $V_{Y25}$ is the voltage generated by the Y scans for the respective test pads $P_1$ to $P_{25}$ (STEP 204). More particularly, the variable voltage output generated by the x movement and the y movement across each test pad $P_1$ to $P_{25}$ is collected and stored for each coordinate $D_X$, $D_Y$ of the individual test pad $P_1$ to $P_{25}$, (STEP 206, STEP 208) thereby providing a mapping for each test pad $P_1$ to $P_{25}$ where $V_X$, $V_Y$ is mapped as a function of $D_X$, $D_Y$ where $D_X$, $D_Y$ represent the distance generated by the x and y scans. (STEP 210, STEP 212). This mapped data may be processed to determine the exact midpoints $D_{MIDX}$, $D_{MIDY}$ of each test pad $P_1$ to $P_{25}$.

In one exemplary embodiment, the distance $D_X$, $D_Y$ correlates to the overall x and y dimension of the respective pad $P_1$ to $P_{25}$. Thus, the midpoints $D_{MIDX}$, $D_{MIDY}$ of each test pad $P_1$ to $P_{25}$ may be determined by dividing the x-dimension and the y-dimension by a factor of 2. In another exemplary embodiment, the distances $D_X$, $D_Y$ are inclusive of areas encompassing the test pads $P_1$ to $P_{25}$ and areas outside the perimeter of the test pads $P_1$ to $P_{25}$. Thus, the mapped data must be examined to identify the location of the respective test pad $P_1$ to $P_{25}$. This may be determined by locating the voltage saturation areas of the scanned data in both the x and y-directions (STEPS 214, 216), which corresponds to the locations of the scanned test pad $P_1$ to $P_{25}$. More specifically, the voltage generated by the photodetectors 36 over the test pads $P_1$ to $P_{25}$ will be substantially greater than areas outside the boundaries of the respective test pads $P_1$ to $P_{25}$. Thus, it is possible to identify the voltage saturation areas of the output data of each scanned test pads $P_1$ to $P_{25}$. Accordingly, the midpoints $D_{MIDX}$, $D_{MIDY}$ of each test pads $P_1$ to $P_{25}$ may be determined by the following formulas:

$$D_{MIDX}=(D_{SAT1(X)}+D_{SAT2(X)})/2-(\text{STEP218})$$

$$D_{MIDY}=(D_{SAT1(Y)}+D_{SAT2(Y)})/2-(\text{STEP220})$$

where $D_{SAT1(X)}$=beginning x saturation point;
$D_{SAT2(X)}$=ending x saturation point;
$D_{SAT1(Y)}$=beginning y saturation point; and
$D_{SAT2(Y)}$=ending y saturation point.

Thus, with the center coordinates $D_{MIDX}$, $D_{MIDY}$ of each test pad $P_1$ to $P_{25}$ known, the operator can confirm alignment with the test probes 14 of the test assembly 10 by comparing the calculated data with reference data stored in the memory of the processor (STEP 222). If alignment is confirmed, no action on behalf of the operator is required and the semiconductor wafer "W" can proceed to testing. If adjustment is needed, the operator can adjust the alignment by entering the coordinate data $D_{MIDX}$, $D_{MIDY}$ into the processor which would initiate movement of the stage and the semiconductor wafer "W" supported by the stage. Once alignment is confirmed (STEP 224), the operator can proceed with performing a test of the integrated circuitry on the semiconductor wafer "W" with the test probes 14. If it is determined that one or more test pads $P_1$ to $P_{25}$ is substantially displaced relative to the reference data or the remaining test pads $P_1$ to $P_{25}$, corrective action on the semiconductor waver "W" may be undertaken including reprocessing of the semiconductor wafer "W" or disposal thereof (STEP 226).

In another exemplary embodiment, the electrical signals generated by the photodetectors 36 may be current signals (I) as opposed to voltage signals, and the centers of the test pads $P_1$ to $P_{25}$ can be calculated via the same methodology used in the voltage measurement.

Figure 12:
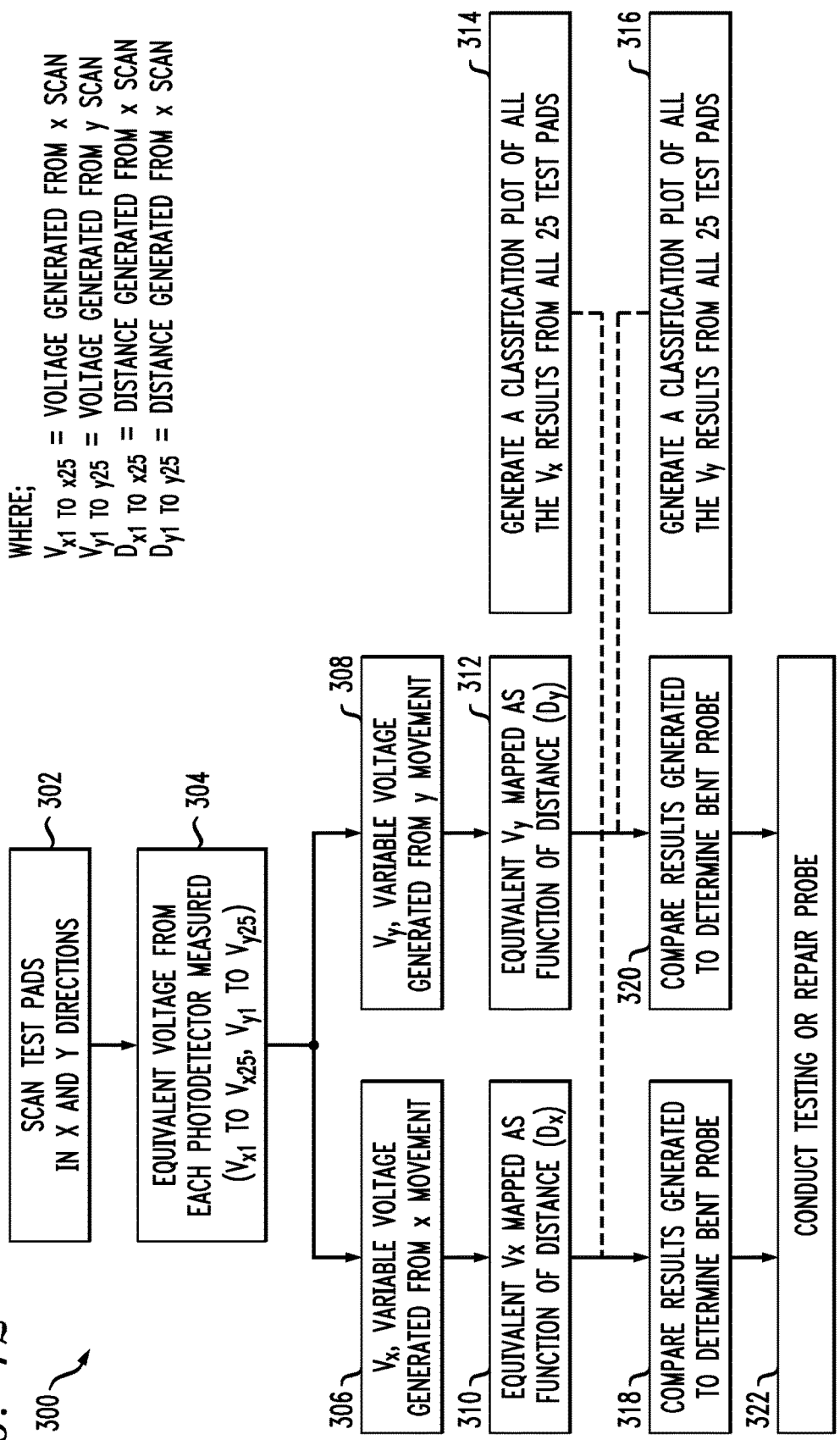
FIG. 12 is a flow chart illustrating an exemplary methodology for determining the integrity of each test probe of the test probe assembly according to one or more embodiments of the invention.

In accordance with another exemplary embodiment of the present application, the data ascertained by scanning of the test pads $P_1$ to $P_{25}$ can be used to check the integrity of a test probe 14, i.e., whether a test probe 14 is misaligned or bent. In general, a bent test probe 14 will displace a test pad $P_i$, e.g., in a prior testing procedure. The displacement of a test pad $P_i$ will be indicative of a bent probe tip. With reference to the flow chart 300 depicted in FIG. 12, the exemplary methodology basically follows the same steps utilized in the alignment of the test probes 14 including scanning of the test pads $P_1$ to $P_{25}$ in the x and y directions (STEP 302), and generating a voltage output (STEP 304) with the photodetectors 36, generating an electrical signal to create an image of each test pads $P_1$ to $P_{25}$ mapped as a function of Distance $D_X$, $D_Y$, respectively. (STEPS 306-312). The method may further include the steps of generating classification plots of all the $V_X$, $V_Y$ results from all twenty-five (25) pads (STEP 314, STEP 316). The results of the classification plots are analyzed (STEP 318, STEP 320) to identify output signals which are outside of the mean distribution of either $V_X$, $V_Y$ of the test pads $P_1$ to $P_{25}$. Any output outside the mean distribution of either $V_X$, $V_Y$ may be indicative of a bent probe, and would need repair or replacement. Otherwise, the test probe assembly may be used for testing of the integrated circuits of the semiconductor wafer "W". (STEP 322).

Thus, in accordance with embodiments of the present application, alignment of all of the test probes 14 relative to the test pads $P_1$ to $P_{25}$ may be ascertained prior to testing. This is in contrast to prior art methodologies where alignment of the test probes 14 is assumed based on the alignment of just a few of the probes. Accordingly, the present application ensures accuracy of the testing procedure prior to its initiation. In addition, the imaging of the test pads $P_1$ to $P_{25}$ in accordance with the present application will identify misplaced wafers "W", e.g., unacceptable positional location of one or more test pads $P_1$ to $P_{25}$, e.g., relative to a reference point of the wafer "W", potentially early on in the manufacturing process thereby minimizing waste and unnecessary manufacturing costs. The image data may also identify a bent or misoriented test probe 14.

Figure 13:
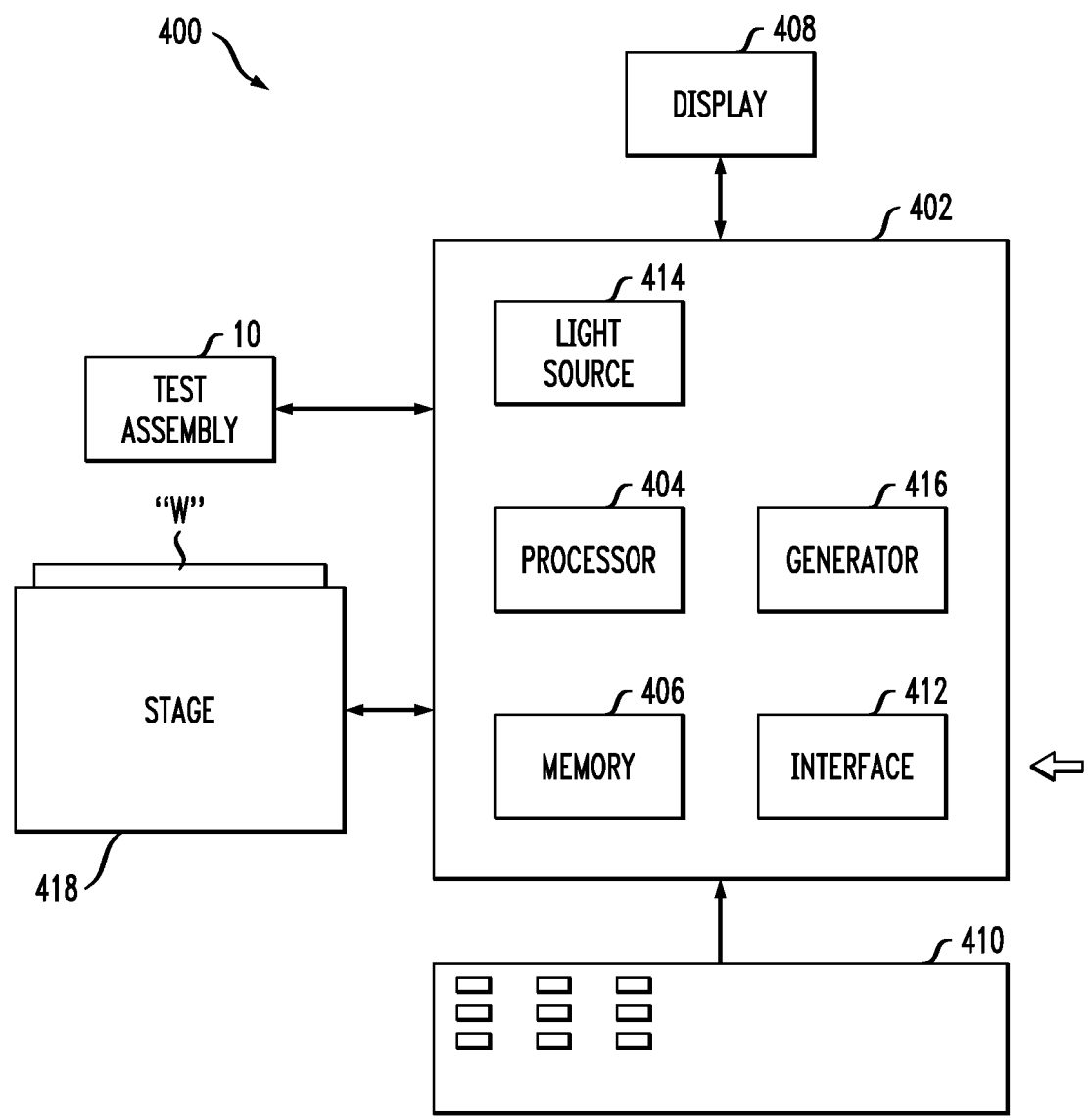
FIG. 13 is a schematic of a system including a processor, a stage for holding a semiconductor wafer and the test probe assembly according to one or more embodiments of the invention.

FIG. 13 illustrates a system 400 adapted for 1) aligning test pads $P_1$ to $P_{25}$ on a semiconductor waver "W" with the test probe assembly 10, 2) identifying displaced test pads $P_1$ to $P_{25}$ and/or 3) identifying a misoriented or bent test probe 14 in accordance with one exemplary embodiment of the present application. The system includes the test assembly 10 of FIGS. 6-7, a workstation 402 including a controller or processor 404 having memory 406 with software or logic programmed to perform the various functions associated with the afore-described testing processes including alignment of the test pads $P_1$ to $P_{25}$, identification of displaced test pads $P_1$ to $P_{25}$ and identification of bent or misoriented test probes 14. The system 400 includes a visual or graphical display 408, a keyboard and mouse 410 for receiving user input and an interface 412 (e.g., wireless or electrical/mechanical connection such as a USB port or a CD-ROM) to permit import of program instructions in accordance with embodiments of the present application. The workstation 402 may further include a light source 414 for delivering light to the fiber optic leads 26. A signal generator 416 configured to deliver electrical signals to the test probe 14 for evaluating the integrated circuits on the semiconductor wafer "W" also may be provided. The system further includes a movable stage 418 upon which the wafer chuck and the semiconductor wafer "W" are positioned. The photodetectors 36 are coupled to the processor 404 such that signal output (either voltage or current) from the photodetectors 36 can be processed by the various software programs, algorithms etc. of the processor 404 to generate the output data relating to the test pads $P_1$ to $P_{25}$ of the semiconductor wafer "W" and the test probes 14 as described hereinabove. The system 400 may be a stand-alone system or a subsystem or module couplable with a conventional testing system such as the TEL prober. The system may be coupled to a public network such as the Internet, or coupled to a private network, an "intra-net." The logic or software containing program instructions embodying methods in accordance with embodiments of the present application may be located on remote computers or within the system. In addition, the system may be coupled to the testing apparatus through a network connection.

Embodiments of the present invention include a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Python, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Figure 14:
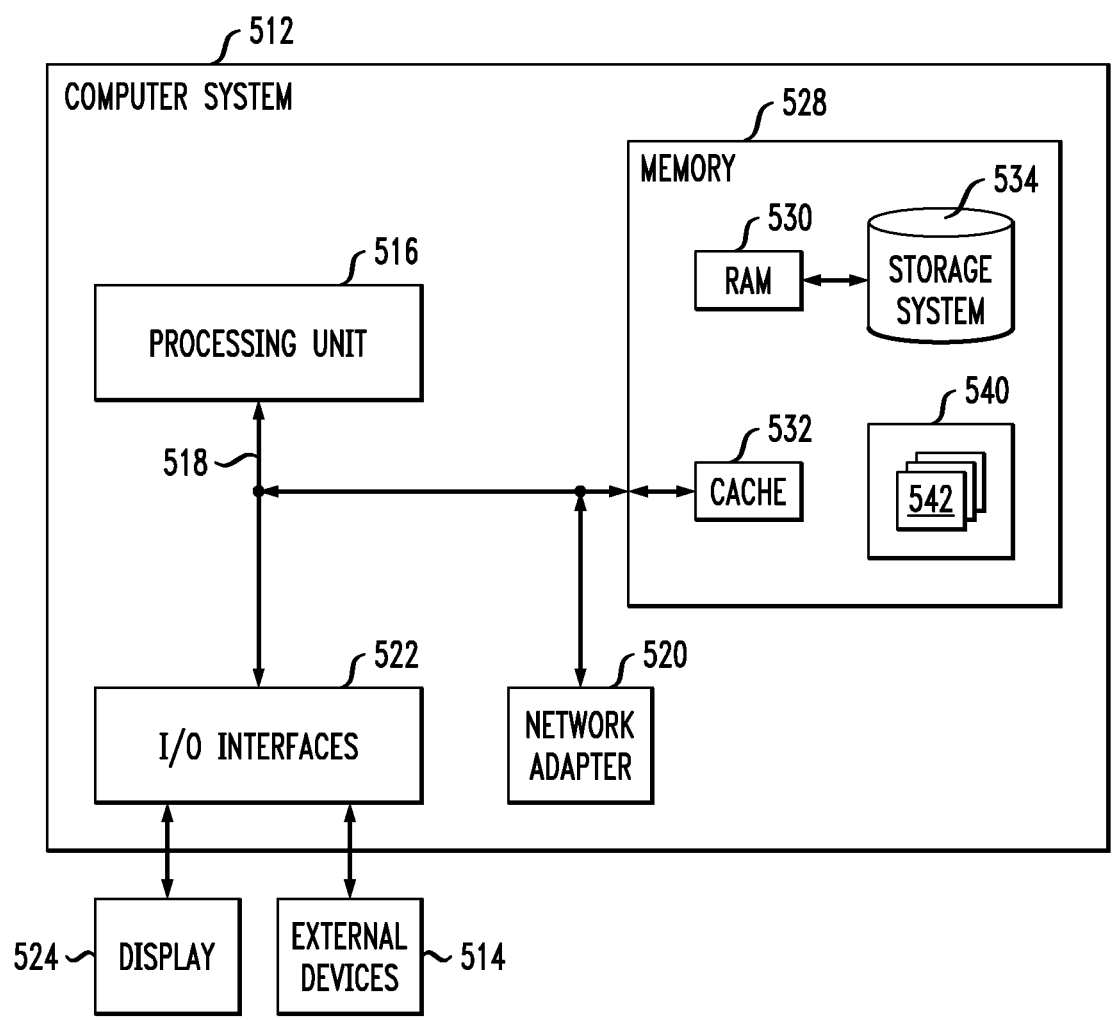
FIG. 14 depicts a computer system in accordance with which one or more components/steps of techniques of the invention may be implemented according to an exemplary embodiment of the invention.

One or more embodiments can make use of software running on a general-purpose computer or workstation. With reference to FIG. 14, in a computing node 510 there is a computer system/server 512, which is operational with numerous other general purposes or special purpose computing system environments or configurations. Examples of well-known computing systems, environments, and/or configurations that may be suitable for use with computer system/server 512 include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, mobile and wearable devices, and distributed cloud computing environments that include any of the above systems or devices, and the like.

Computer system/server 512 may be described in the general context of computer system executable instructions, such as program modules, being executed by a computer system. Generally, program modules may include routines, programs, objects, components, logic, data structures, and so on that perform particular tasks or implement particular abstract data types. Computer system/server 512 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 14, computer system/server 512 in computing node 510 is shown in the form of a general-purpose computing device. The components of computer system/server 512 may include, but are not limited to, one or more processors or processing units 516, a system memory 528, and a bus 518 that couples various system components including system memory 528 to processor 516.

The bus 518 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

The computer system/server 512 typically includes a variety of computer system readable media. Such media may be any available media that is accessible by computer system/server 512, and it includes both volatile and non-volatile media, removable and non-removable media.

The system memory 528 can include computer system readable media in the form of volatile memory, such as random access memory (RAM) 530 and/or cache memory 532. The computer system/server 512 may further include other removable/non-removable, volatile/nonvolatile computer system storage media. By way of example only, storage system 534 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to the bus 518 by one or more data media interfaces. As depicted and described herein, the memory 528 may include at least one program product having a set (e.g., at least one) of program modules that are configured to carry out the functions of embodiments of the invention. A program/utility 540, having a set (at least one) of program modules 542, may be stored in memory 528 by way of example, and not limitation, as well as an operating system, one or more application programs, other program modules, and program data. Each of the operating system, one or more application programs, other program modules, and program data or some combination thereof, may include an implementation of a networking environment. Program modules 542 generally carry out the functions and/or methodologies of embodiments of the invention as described herein.

Computer system/server 512 may also communicate with one or more external devices 514 such as a keyboard, a pointing device, a display 524, etc., one or more devices that enable a user to interact with computer system/server 512, and/or any devices (e.g., network card, modem, etc.) that enable computer system/server 512 to communicate with one or more other computing devices. Such communication can occur via I/O interfaces 522. Still yet, computer system/server 512 can communicate with one or more networks such as a LAN, a general WAN, and/or a public network (e.g., the Internet) via network adapter 520. As depicted, network adapter 520 communicates with the other components of computer system/server 512 via bus 518. It should be understood that although not shown, other hardware and/or software components could be used in conjunction with computer system/server 512. Examples include, but are not limited to, microcode, device drivers, redundant processing units, external disk drive arrays, RAID systems, tape drives, and data archival storage systems, etc.

It is to be understood that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported, providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure that includes a network of interconnected nodes.

Figure 15:
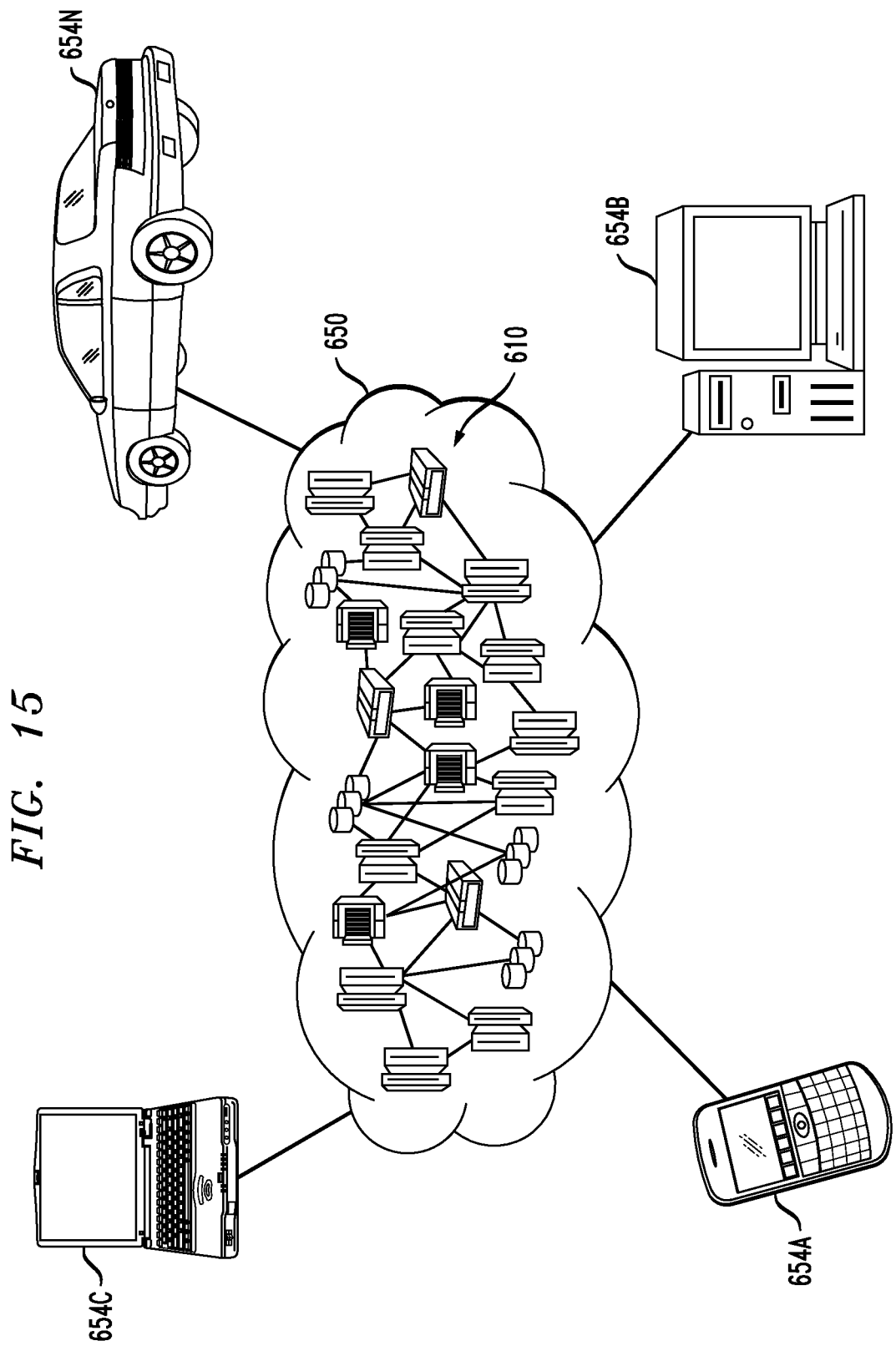
FIG. 15 depicts a cloud computing environment according to an exemplary embodiment of the present invention.

Referring now to FIG. 15, illustrative cloud computing environment 650 is depicted. As shown, cloud computing environment 650 includes one or more cloud computing nodes 610 with which local computing devices used by cloud consumers, such as, for example, personal digital assistant (PDA) or cellular telephone 654A, desktop computer 654B, laptop computer 654C, and/or automobile computer system 654N may communicate. Nodes 610 may communicate with one another. They may be grouped (not shown) physically or virtually, in one or more networks, such as Private, Community, Public, or Hybrid clouds as described hereinabove, or a combination thereof. This allows cloud computing environment 650 to offer infrastructure, platforms and/or software as services for which a cloud consumer does not need to maintain resources on a local computing device. It is understood that the types of computing devices 654A-N shown in FIG. 15 are intended to be illustrative only and that computing nodes 610 and cloud computing environment 650 can communicate with any type of computerized device over any type of network and/or network addressable connection (e.g., using a web browser).

Figure 16:
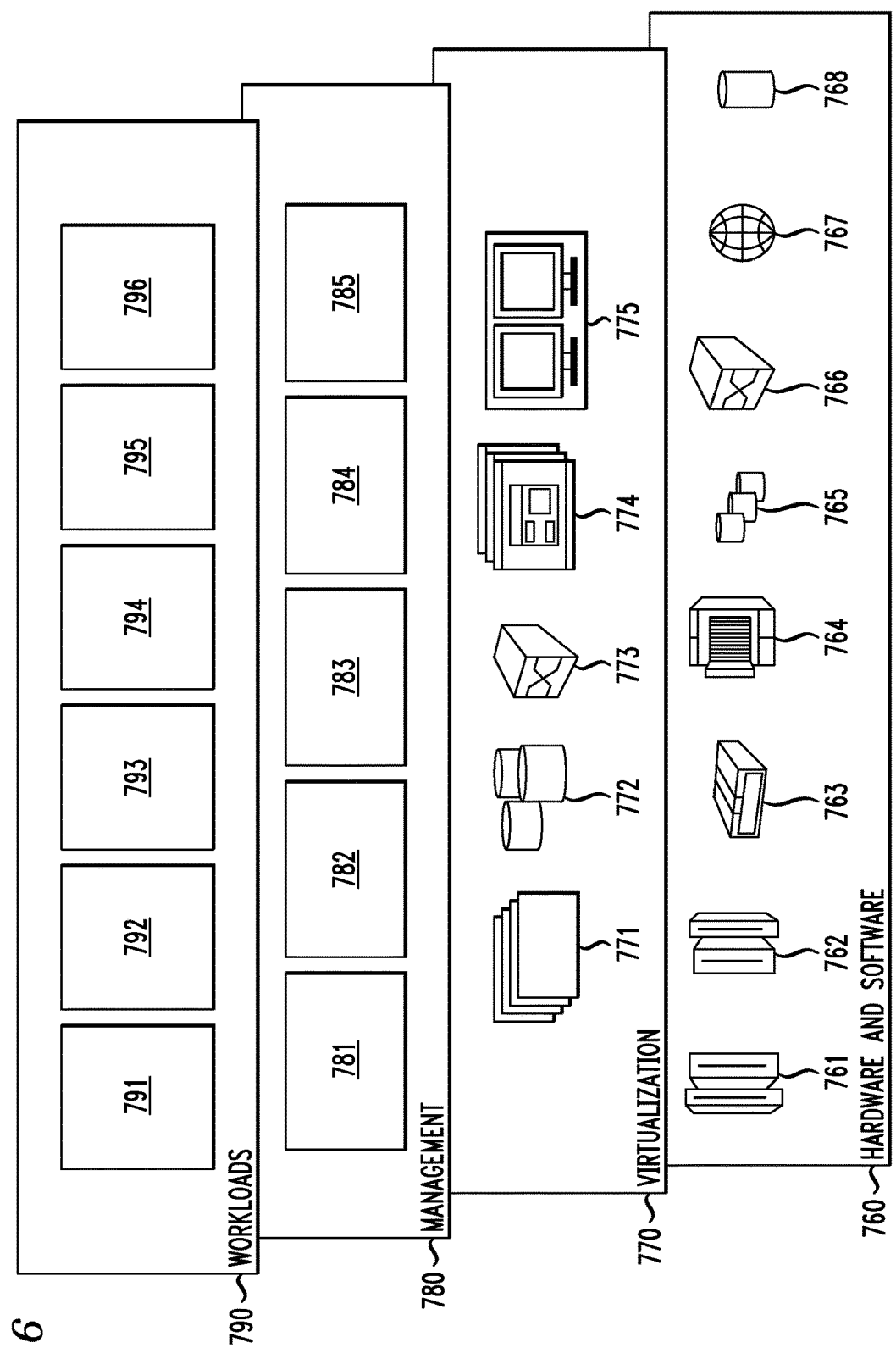
FIG. 16 depicts abstraction model layers according to an exemplary embodiment of the present invention.

Referring now to FIG. 16, a set of functional abstraction layers provided by cloud computing environment 650 (FIG. 15) is shown. It should be understood in advance that the components, layers, and functions shown in FIG. 16 are intended to be illustrative only and embodiments of the invention are not limited thereto. As depicted, the following layers and corresponding functions are provided:

Hardware and software layer 760 includes hardware and software components. Examples of hardware components include: mainframes 761; RISC (Reduced Instruction Set Computer) architecture based servers 762; servers 763; blade servers 764; storage devices 765; and networks and networking components 766. In some embodiments, software components include network application server software 767 and database software 768.

Virtualization layer 770 provides an abstraction layer from which the following examples of virtual entities may be provided: virtual servers 771; virtual storage 772; virtual networks 773, including virtual private networks; virtual applications and operating systems 774; and virtual clients 775.

In one example, management layer 780 may provide the functions described below. Resource provisioning 781 provides dynamic procurement of computing resources and other resources that are utilized to perform tasks within the cloud computing environment. Metering and Pricing 782 provide cost tracking as resources are utilized within the cloud computing environment, and billing or invoicing for consumption of these resources. In one example, these resources may include application software licenses. Security provides identity verification for cloud consumers and tasks, as well as protection for data and other resources. User portal 783 provides access to the cloud computing environment for consumers and system administrators. Service level management 784 provides cloud computing resource allocation and management such that required service levels are met. Service Level Agreement (SLA) planning and fulfillment 785 provide pre-arrangement for, and procurement of, cloud computing resources for which a future requirement is anticipated in accordance with an SLA.

Workloads layer 790 provides examples of functionality for which the cloud computing environment may be utilized. Examples of workloads and functions which may be provided from this layer include: mapping and navigation 791; software development and lifecycle management 792; virtual classroom education delivery 793; data analytics processing 794; transaction processing 795; and test pad alignment and probe integrity processing 796, which may perform various functions described above with respect to mapping test pads, identifying the centers thereof, aligning the test probes with the test pads and detecting bent probe structures using the methodologies and techniques described herein.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A test probe assembly, comprising:
   at least one probe card including a first probe card portion and a second probe card portion;
   a plurality of test probes mounted to the first probe card portion, the test probes each having a probe end for positioning adjacent respective individual test pads of a semiconductor wafer;
   a fiber optic lead coupled to each test probe, the fiber optic leads arranged to direct incident light toward respective individual test pads of the semiconductor wafer; and
   a plurality of photodetectors coupled to the second probe card portion, each individual photodetector being associated with a respective individual test probe, the photodetectors being positioned and configured for reception of light reflected off respective individual test pads to emit output signals used to generate image data of the individual test pads.

2. The assembly according to claim 1 wherein each fiber optic lead terminates at a position spaced from the probe end of the test probe.

3. The assembly according to claim 2 wherein the fiber optic leads are each adhered to the test probes.

4. The assembly according to claim 2 wherein the test probes each include a coaxially mounted sheath, the fiber optics leads each being adhered to the sheath of the test probe.

5. The assembly according to claim 2 wherein each fiber optic lead is arranged to deliver light in general alignment with the probe ends of respective test probes.

6. The assembly according to claim 5 wherein each test probe includes a probe tip segment leading to the probe end, the probe tip segment obliquely arranged with respect to a remaining segment of the test probe.

7. The assembly according to claim 6 wherein the fiber optic lead follows a path of the probe tip segment.

8. A method, comprising the steps of:
positioning at least one probe card relative to a semiconductor wafer having a plurality of test pads, the at least one probe card including a first probe card portion and a second probe card portion;
coupling a plurality of test probes to the first probe card portion;
mounting a fiber optic lead to each test probe, the fiber optic lead configured to transmit light;
mounting a plurality of photodetectors to the second probe card portion, each individual photodetector being associated with respective individual test probes;
transmitting light from the fiber optic lead of each test probe to a corresponding test pad; and
capturing light signals emitted off the test pads with the respective photodetectors associated with the test probes.

9. The method according to claim 8 wherein mounting includes securing a fiber optic lead to each test probe.

10. The method according to claim 9 wherein mounting includes securing each fiber optic lead whereby light emitted by the fiber optic lead is in general alignment with probe ends of respective test probes.

11. A method, comprising the steps of:
positioning a test probe assembly, comprising at least one probe card including first and second probe card portions and having a plurality of test probes extending from the first probe card portion, relative to a semiconductor wafer;
transmitting light from a fiber optic lead coupled to each test probe toward an individual test pad of the semiconductor wafer;
collecting light reflected off each individual test pad with an individual photodetector associated with each test probe and mounted to the second probe card portion; and
generating image data representative of each test pad in response to electrical output signals emitted by the photodetectors.

12. The method according to claim 11 wherein transmitting light includes scanning each test pad in at least an x-direction and a y-direction to generate image data, the generating including mapping x and y coordinates of each test pad.

13. The method according to claim 12 including calculating a midpoint $D_{MIDX}$, $D_{MIDY}$ of each test pad based on the x and y data coordinates.

14. The method according to claim 13 including aligning the test probes in accordance with the respective calculated midpoints $D_{MIDX}$, $D_{MIDY}$ of the test pads.

15. The method according to claim 12 including determining a positional location of each test pad relative to reference data stored in memory of a processor.

16. The method according to claim 12 determining a condition of a test probe based on the image data.

17. The method according to claim 16 wherein the condition is the presence of a bent probe tip segment.

18. The method according to claim 16 wherein determining the condition of a test probe comprises identifying electrical output signals of a given photodetector which are outside a mean distribution of the electrical output signals of at least some of the remaining photodetectors.

19. A system, comprising:
a test probe assembly, including:
at least one probe card comprising a first probe card portion and a second probe card portion;
a plurality of test probes mounted to the first probe card portion, the test probes each having a probe end for positioning adjacent respective individual test pads of a semiconductor wafer;
a fiber optic lead coupled to each test probe, the fiber optic leads arranged to direct incident light toward respective individual test pads of the semiconductor wafer; and
a plurality of photodetectors secured to the second probe card portion, individual photodetectors associated with respective individual test probes and configured for reception of reflected light reflected off respective individual test pads to generate output signals representative of a characteristic of the individual test pads;
a light source coupled to the fiber optic leads,
a stage for holding the semiconductor wafer;
a processor for causing movement of the stage relative to the test probes and the fiber optic leads such that the fiber optic leads scan the test probes in at least an x-direction and a y-direction, the processor configured for receiving the output signals from the photodetectors to provide image data based on the output signals; and
a visual display for displaying at least one image associated with the image data.

20. The system according to claim 19 wherein the processor includes logic to process the image data to determine positional data of each test pad relative to reference data stored in memory of the processor.

21. The system according to claim 19 wherein the processor includes logic to process the image data to determine a center of each test pad.

22. The system according to claim 19 wherein the processor includes logic to process the image data to determine a physical characteristic of each test probe.

23. The system according to claim 22 wherein the physical characteristic is a bent probe segment.

24. The system according to claim 22 wherein the logic is configured to identify output signals of a given photodetector which are outside a mean distribution of the output signals of at least some of the remaining photodetectors.

25. The method of claim 24 wherein the output signal is one of voltage and current.

26. A The test probe assembly, comprising:
at least one probe card including a first probe card portion and a second probe card portion;

a plurality of test probes coupled to the first probe card portion, the test probes each having a probe end for positioning adjacent respective individual test pads of a semiconductor wafer;

a light source coupled to each test probe, the light sources arranged to direct incident light toward the respective individual test pads of the semiconductor wafer;

a plurality of photodetectors secured to the second probe card portion and extending outwardly from the second probe card portion, individual photodetectors configured for reception of reflective light reflected off the respective individual test pads.

27. The test probe assembly according to claim 26 wherein the light sources each comprise a fiber optic lead operatively coupled to each test probe.

28. The test probe assembly according to claim 26 further including:

a processor including logic to process the output signals from at least some of the plurality of photodetectors, and configured to perform at least one of the following:

identify a displaced test pad on the semiconductor wafer; or identify a misoriented or bent test probe.

29. The test probe assembly according to claim 28 further including:

generating image data representative of each test pad in response to the output signals emitted by the photodetectors.

* * * * *